United States Patent [19]

Shannon

[11] 3,739,237

[45] June 12, 1973

[54] METHODS OF MANUFACTURING INSULATED GATE FIELD EFFECT TRANSISTORS

[75] Inventor: John Martin Shannon, Reigate, England

[73] Assignee: U.S. Philips Corporation, New York, N.Y.

[22] Filed: Dec. 18, 1970

[21] Appl. No.: 99,616

[30] Foreign Application Priority Data

Dec. 24, 1969 Great Britain .................. 62,909/69

[52] U.S. Cl. ................ 317/235 R, 29/571, 29/578, 317/235 B

[51] Int. Cl. ......................... B01j 17/00, H01l 11/00

[58] Field of Search ................ 29/571, 578, 576 B; 317/235 AY

[56] References Cited

UNITED STATES PATENTS

| | | | |
|---|---|---|---|
| 3,562,022 | 2/1971 | Shifrin | 29/578 |
| 3,590,471 | 7/1971 | Lepselter | 29/571 |

*Primary Examiner*—Charles W. Lanham
*Assistant Examiner*—W. Tupman
*Attorney*—Frank R. Trifari

[57] ABSTRACT

A method of making an IGFET by implantation techniques is described. The method features provision of the source and drain contact metal on the semiconductor surface and an adjoining insulator, provision of a gate electrode structure which will mask ions, and then ion bombardment under such conditions that the ions do not penetrate the gate electrode structure thereby defining a channel precisely aligned with the gate, but ions do penetrate the adjacent structure to form in the underlying semiconductor source and drain surface regions wholly defined by the implantation and whose p-n junctions terminate under the insulator. Upon completion, the source and drain contacts for the source and drain regions are automatically established. Various methods are described for controlling the locations where the ions are masked or are permitted to penetrate into the semiconductor.

12 Claims, 11 Drawing Figures

Patented June 12, 1973 3,739,237

4 Sheets-Sheet 1

Figure 1:
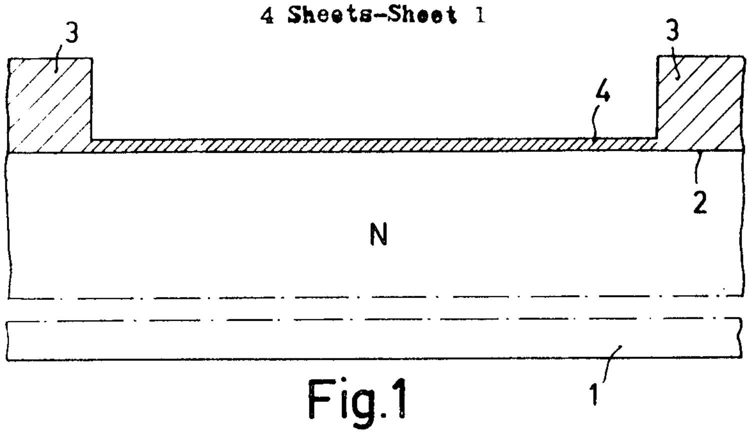
Figure 2:
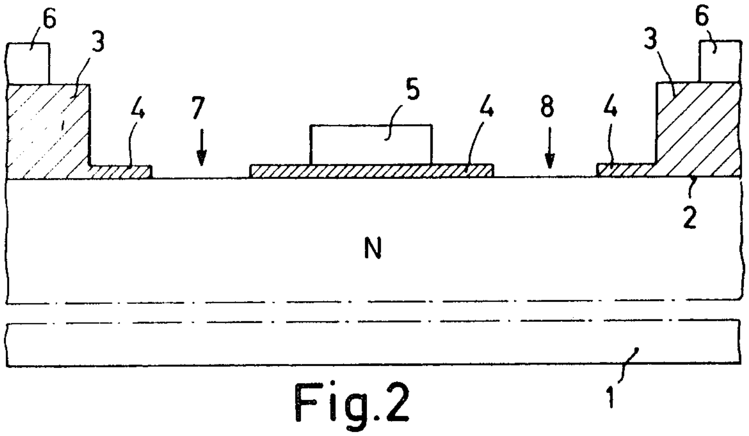

INVENTOR.

BY JOHN M SHANNON

AGENT

INVENTOR.

BY JOHN M. SHANNON

AGENT

INVENTOR.

BY JOHN M. SHANNON

[signature]

AGENT

INVENTOR

BY JOHN M. SHANNON

AGENT

METHODS OF MANUFACTURING INSULATED GATE FIELD EFFECT TRANSISTORS

This invention relates to methods of manufacturing insulated gate field effect transistors and to insulated gate field effect transistors manufactured by such methods. Such an insulated gate field effect transistor may form part of a semiconductor integrated circuit.

In semiconductor technology the process of ion implantation has been employed in the manufacture of solar cells and radiation detectors. Ion implantation generally involves the bombardment of semiconductor material with a beam of energetic dopant ions to form regions of different conductivity and/or conductivity type in the semiconductor material. More recently ion implantation has also been used in the manufacture of insulated gate field effect transistors. In our U.S. Pat. No. 3,596,347, there is described a method of manufacturing an insulated gate field effect transistor, in which in a semiconductor body or body part of one conductivity type there are initially formed, for example by a diffusion step, two spaced, low resistivity regions of the opposite conductivity type, said regions extending in the semiconductor body or body part from one surface thereof, source and drain electrode metal layer parts are provided which extend in openings in an insulating layer on the one surface to form ohmic contact with surface portions of said two low resistivity regions and a gate electrode metal layer part is provided at an area of the one surface lying within the area on the one surface between the two low resistivity regions, said gate electrode metal layer part being spaced from the one surface by an insulating layer, whereafter ions of a conductivity type determining impurity element characteristic of the opposite conductivity type are implanted through the insulating layer parts on the one surface not masked by the source, drain and gate electrode metal layer parts and into the portions of the semiconductor body or body part underlying said insulating layer parts to extend the two low resistivity regions towards each other and form spaced, low resistivity source and drain regions of the opposite conductivity type which define at the surface adjacent region therebetween a current carrying channel region, the length of the current carrying channel region in the direction between the source and drain regions so formed corresponding substantially to the dimension of the gate electrode metal layer part in said direction.

In this method an insulated gate field effect transistor is formed in which substantially no overlap of the gate electrode metal layer with the source and drain regions occurs so that, in particular, the capacitance between the gate and drain is very low, for example this capacitance may be reduced to one twentieth of the value obtained for a device formed by the conventional diffusion techniques. This permits devices to be obtained in which the frequency of operation may be high. As this method yields a transistor in which the length of the current carrying channel region corresponds substantially to the corresponding dimension of the overlying gate electrode metal layer part, the said length of the channel may be controlled accurately and may be made comparatively smaller than is normally readily possible in a method employing diffusion techniques alone. Furthermore by the implantation of ions into the said portions of the semiconductor body or body part through said unmasked insulating layer parts on the one surface, a relatively simple method is provided since the insulating layer parts through which the implantation of ions occurs may form part of the same insulating layer as that on which the gate electrode metal layer part is present and hence after the implantation no further processing steps to remove any parts of this insulating layer will be necessary because the source and drain electrode metal layers are already provided extending in openings therein. One disadvantage of the method is that a two-stage process is involved in the formation of the source and drain regions in the semiconductor body or body part, that is an initial step, for example a diffusion step, to form the two low resistivity regions which are contacted by the source and drain metal layer parts and the subsequent implantation step to extend these regions towards each other.

Another method of manufacturing an insulated gate field effect transistor in which ion implantation is used has also been proposed. In this method the initial stage comprises the forming of platinum silicide layer parts at the surface of an n-type silicon body and applying source and drain electrode metal layers so that they form contact with part of the platinum silicide layer and leave portions thereof uncovered on opposite sides of the gate electrode structure. Implanatation of boron ions is then carried out using the gate electrode structure as a mask, the implantation occurring through the uncovered portions of the platinum silicide layers and p-type source and drain region parts being formed in the surface parts on opposite sides of the surface part below the gate electrode structure, these source and drain region parts underlying the uncovered portions of the platinum silicide layers which form a low resistance path between these implanted regions and the source and drain electrode metal layers. The platinum silicide layers also form Schottky barriers with the non-implanted n-type parts of the semiconductor body. This method also provides a precisely controlled channel region but also has the disadvantage that the source and drain regions are formed by a two-stage process, that is the platinum silicide layer formation and definition and the later implantation step and it is difficult to provide a good contacting by the metal to platinum silicide regions over a large area of a slice on which a plurality of insulated gate field effect transistors are formed. Furthermore, the further disadvantage arises that it is not readily possible to adapt this method to form an n-channel device starting with a p-type silicon body because it is difficult to form a Schottky barrier with p-type silicon and impossible to do so with platinum silicide. Also in the said device using platinum silicide the danger exists of shorting the source/substrate and drain/substrate p-n junctions by the source and drain contact layers where these junctions extend to the surface at the far extremities of the platinum silicide parts.

This invention provides a method of manufacturing an insulated gate field effect transistor in which by suitable control of ion bombardment and the electrode layers, the source and drain regions in the semiconductor body or body part are formed by a single implantation step.

According to the invention in a method of manufacturing an insulated gate field effect transistor, at a surface of a semiconductor body or body part of one conductivity type, source, drain and gate electrode layers are provided, the gate electrode layer being separated from the semiconductor surface by insulating material, the source and drain electrode layers comprising continuous metal layer parts extending on insulating material on the semiconductor surface from openings in the insulating material and there forming contact with semiconductor surface regions on opposite sides of the surface region below the gate electrode layer, whereafter ion bombardment is effected at said surface with ions of a conductivity type determining impurity element characteristic of the opposite conductivity type, the conditions of ion bombardment, the gate electrode structure and the source and drain metal layer parts being such that ions do not penentrate to the surface part below the gate electrode layer which part is masked by the gate electrode layer and underlying insulating material and implantation of ions is effected in the adjoining surface parts on opposite sides including the surface parts below the source and drain metal layer parts in the openings by penetration of these metal layer parts by the ions so that source and drain surface regions of the opposite conductivity type are wholly defined by implantation and further define in the surface region below the gate electrode layer a current carrying channel region the length of which in the direction between the source and drain regions corresponds substantially to the dimension of the gate electrode layer in said direction, the p-n junctions between the source and drain regions of the opposite conductivity type and the body or body part of the one conductivity type terminating wholly at the semiconductor surface below insluating material.

In this method in which the area of implantation includes the surface parts below the source and drain metal layer parts in the openings due to the penetration of these metal layer parts by the ions, implanted source and drain surface regions of the opposite conductivity type thus formed already have electrodes thereon, that is the source and drain electrode metal layer parts. Consequently this method in addition to providing a precisely controlled current carrying channel region due to the masking of the ions by the gate electrode structure, also provides the source and drain regions in the semiconductor body or body part by a single implantation step and the necessity of initially forming parts of these regions which are extended by the subsequently effected ion implantation as occurs in the above described prior art methods no longer arises. Furthermore by this method good low resistance contacts to the implanted source and drain regions are provided by the metal layer parts through which the ions penetrate. Another advantage of a method in accordance with the invention is that the transistor may be formed having a relatively small area. This is particularly important when the transistor forms part of an integrated circuit. The method may be employed for the manufacture of p-channel or n-channel devices.

The conditions of ion bombardment, the gate electrode structure and the source and drain metal layer parts may be determined in various ways to yield the selective implantation in the said adjoining surface parts. Reference to the gate electrode structure is to be understood to mean the gate electrode layer and the underlying insulating material. The selective implantation may be achieved with ions of an appropriate element having a sufficient energy to penetrate the source and drain metal layer parts and in some cases the gate electrode layer. For example when the gate electrode layer is of metal and of the same structure as the source and drain metal layer parts, the masking of the semiconductor surface below the gate electrode layer can be determined by a gate electrode structure in which the insulating material is of a sufficient thickness to arrest the ions which penetrate the overlying gate electrode metal layer.

In a preferred form of obtaining the selective implantation a gate electrode layer is provided which has a different structure to the source and drain metal layer parts. This difference in structure may be provided in various different forms. In one form the gate electrode layer is of metal and is of different composition to the source and drain metal layer parts. For the manufacture of a silicon insulated gate field effect transistor by the last described form of the method in accordance with the invention the source and drain metal layer parts may be of aluminum and the gate electrode layer comprises a molybdenum layer or a nickel layer on the insulating material. The provision of aluminum source and drain electrode metal layer parts which have a thickness such that the bombarding ions can penetrate to the underlying silicon surface can be readily achieved. For example in the formation in a p-channel device having low resistivity p-type ion implanted source and drain regions, aluminum source and drain electrode layers may be used, for example of 0.1 to 0.3 micron thickness, said thickness being chosen in accordance with the energy of the bombarding ions which may be of boron, for example in the range of 80 to 150 KeV. Furthermore, using boron ions a molybdenum gate electrode layer or a nickel gate electrode layer of appropriate thickness, for example of at least 0.2 to 0.3 micron for molybdenum and at least 0.3 to 0.4 micron for nickel depending upon the energy of the boron ions, will not allow penetration of the boron ions to the underlying semiconductor surface part. The gate electrode layer may further comprise an aluminum on the molybdenum layer or nickel layer, said aluminum layer being provided simultaneously with the source and drain metal layer parts.

In another form of the method in which a gate electrode layer is provided which has a different structure to the source and drain metal layer parts, the gate electrode layer is of metal and the source and drain metal layer parts are of the same metal but of smaller thickness than the gate electrode metal layer. For the manufacture of a silicon insulated gate field effect transistor aluminum can be used for the source, drain and gate electrode layers, the aluminum gate electrode layer having an appreciably greater thickness than the source and drain metal layer parts in contact with the semiconductor surface. When this form of the method is used for the manufacture of a p-channel device in which low resistivity p-type source and drain regions are formed by implantation of boron ions having energies in the range of 80 — 150 KeV. an aluminum gate electrode layer having a minimal thickness in the range of 0.5 to 0.75 micron for said range of energies will prevent penetration of the boron ions to the underlying semiconductor surface whereas source and drain metal layer parts having a maximum thickness in the range of 0.1 to 0.3 micron for said range of energies will be suitably penetrated.

The insulating material on the semiconductor surface may be applied in various ways. In one preferred form in which the selective implantation is obtained by providing a gate electrode layer which has a different structure to the source and drain metal layer parts, the insulating material on the surface below the gate electrode layer and the insulating material on the surface below the source and drain metal layer parts adjacent the openings consist of the same insulating layer which is formed prior to providing the source, drain and gate electrode layers. In order to limit the lateral area of implantation which occurs by penetration of the source and drain metal layer parts and the underlying insulating material beyond the openings in the insulating layer, the insulating layer may have a greater thickness beyond said openings. This may be realised by providing a first, thicker insulating layer on the semiconductor surface, removing an area of said insulating layer and thereafter forming a second, thinner insulating layer on the semiconductor surface at said area, the openings being formed in the thinner insulating layer and the gate electrode layer and the source and drain metal layer parts being provided on the thinner insulating layer. The source, drain and gate electrode layers may further extend on the thicker insulating layer, the parts of the electrode layers on the thicker insulating layer having a thickness sufficient to prevent the penetration of the bombarding ions into the undelying thicker insulating layer and semiconductor surface.

The source and drain metal layer parts may be provided so that they do not occupy the total area of the openings in the insulating material and implantation of ions is effected preferentially in the surface parts below the openings which are not covered by the metal layer parts.

In a method in accordance with the invention the conditions of ion bombardment may be such that at least at the areas where the source and drain metal layer parts contact the semiconductor surface atoms of the metal layer parts are caused to enter th underlying semiconductor surface parts by energy transfer from the bombarding ions. This form of implantation is referred to as knock-on implantation and is generally described in our co-pending U.S. Pat. application Ser. No. 89,156, filed Nov. 3, 1970.

Figure 10:
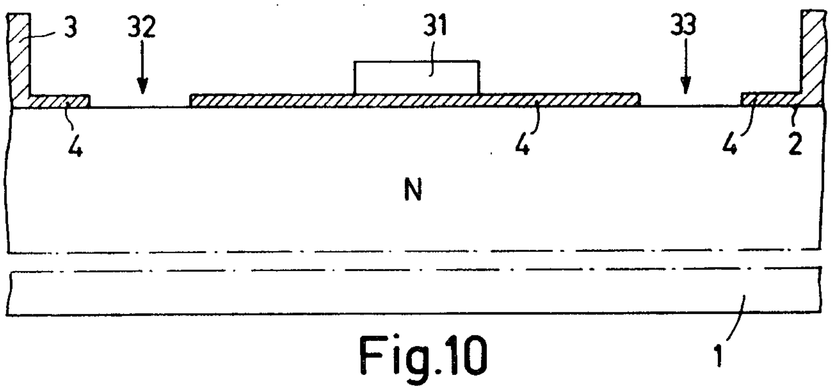
Figure 11:
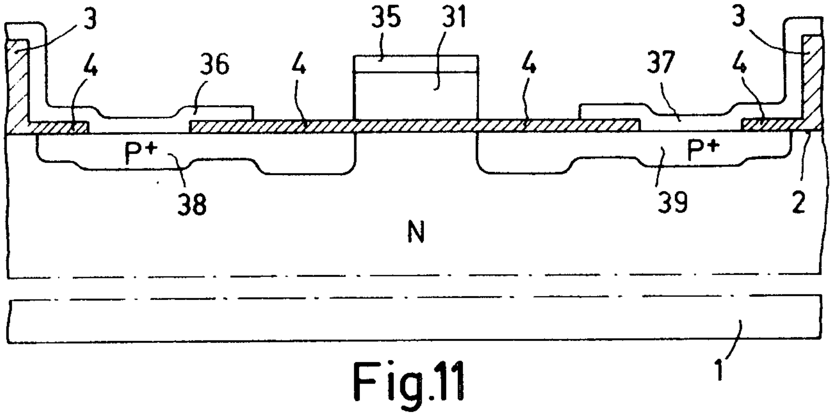

Embodiments of the invention will now be described, by way of example, with reference to the accompanying diagrammatic drawings, in which:

FIGS. 1 to 5 are vertical sections through part of a silicon semiconductor body during various stages in the manufacture by a first method in accordance with the invention of a p-channel silicon insulated gate field effect transistor;

FIGS. 6 to 9 are vertical sections through part of a silicon semiconductor body during various stages in the manufacture by a second method in accordance with the invention of another p-channel silicon insulated gate field effect transistor; and FIGS. 10 and 11 are vertical sections through part of a silicon semiconductor body during two different stages in the manufacture by a third method, which is a modification of said second method, of a further p-channel silicon insulated gate field effect transistor.

Referring now to FIGS. 1 to 5, a method of manufacturing a p-channel silicon insulated gate field effect transistor will now be described. The starting material is a slice of n-type silicon of approximately 2.5 cm diameter and 3 ohm-cm. resistivity. The processing is carried out to form simultaneously a plurality of transistors on the slice which are separated at a late stage in the manufacture by dividing slice. slice. However, the main steps in the manufacture of one such transistor on the slice will now be described, it being understood that the various steps involved prior to dividing the slice are each carried out simultaneously at a plurality of locations on the slice.

The orientation of the slice is 100. FIG. 1 shows a part 1 of the slice having a surface 2 which is suitably prepared to be optically flat by the normal techniques of polishing and etching. On the whole surface 2 there is deposited from silane a silicon oxide layer 3 of approximately 10,000 A. thickness. By photoprocessing and etching techniques a central rectangular opening of 28 microns × 50 microns is formed in the silicon oxide layer 3 to expose the underlying silicon surface 2. An oxidation step is then carried out to thermally grow a thinner silicon oxide layer in the opening, the oxidation being in wet oxygen for 5 minutes at 1,100°C and yielding an oxide layer 4 of approximately 1,200 A. thickness. During this process the thickness of the remaining part of the oxide layer 3 increases to a small extent. FIG. 1 shows part of the body 1 having the remaining part of the thicker oxide layer 3 with the thinner oxide 4 in the 28 microns × 50 microns opening in the thicker oxide layer 3.

A layer of molybdenum of 5,000 A. thickness is then provided on the surface of the oxide layer 3,4 by evaporation.

Figure 3:
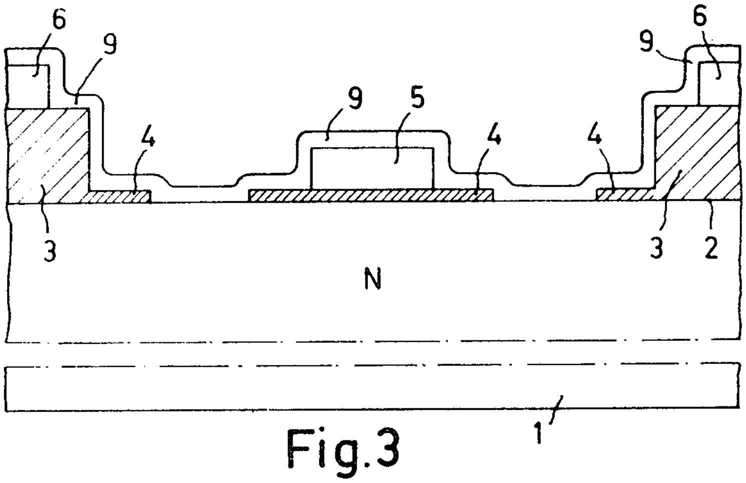

By a photoprocessing and etching step the molybdenum layer is selectively removed from two rectangular areas each of approximately 13 microns × 60 microns to leave a central portion 5 of 6 microns × 60 microns centrally disposed on the thinner oxide layer 4 and an outer portion 6 situated on the thicker oxide layer 3 and connected (not shown) to the centrally disposed portion 5. By a further photoprocessing and etching step two rectangular openings 7 and 8 of 5 microns × 40 microns are formed in the thinner oxide layer 4 extending parallel to and on opposite sides of the molybdenum layer part 5. In the section shown in FIG. 2 the edges of the openings are spaced approximately 3 microns from the nearest edges of the molybdenum layer part 5. After a light cleaning etching of the silicon surface exposed by the openings 7 and 8 an aluminum layer 9 of 2000 A. thickness is deposited over the whole surface, including the openings 7 and 8 and the molybdenum layer parts 5 and 6. FIG. 3 shows the body after the aluminum deposition.

Figure 4:
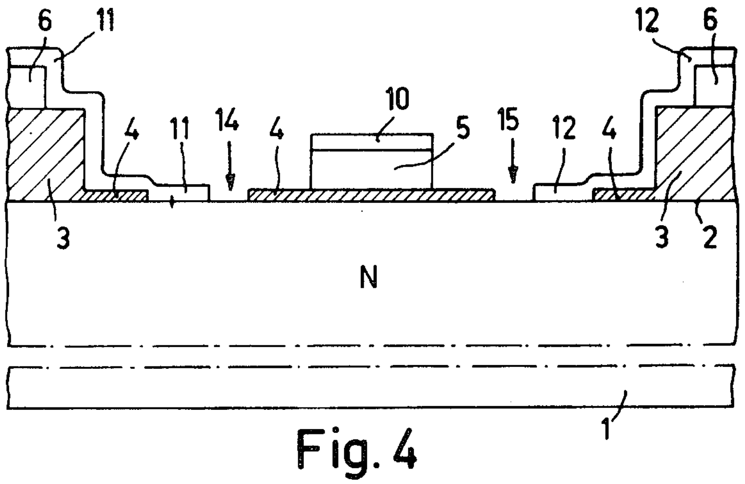

By a further photoprocessing and etching step the aluminum layer is selectively removed to leave a portion 10 on the molybdenum layer part 5 and portions 11 and 12 which form contact with the silicon surface in the openings 7 and 8 respectively. The portions 11 and 12 further extend on the thinner oxide layer 4, then on the adjoining thicker oxide layer 3 and then on the molybdenum layer part 6. The aluminum layer parts 10, 11 and 12 all merge into a single aluminum layer part on the molybdenum layer part 6 on the thicker oxide layer 3 beyond the periphery of the opening therein containing the thinner oxide layer 4. The metal layer parts 11 and 12 constitute source and drain electrode layer parts and the molybdenum layer part 5 with the overlying aluminum layer part 10 thereon constitute the gate electrode layer. The aluminum layer parts 11 and 12 do not occupy the total areas of the openings 7 and 8 on opposite sides of the gate electrode structure 10, 5, 4 and rectangular portions 14 and 15 of the silicon surface of approximately 2 microns × 40 microns are left uncovered. FIG. 4 shows the body after defining the aluminum layer to leave the parts 10, 11 and 12 and the exposed surface parts 14 and 15 of the originally formed openings 7 and 8 respectively.

The body is then placed in the target chamber of an ion bombardment apparatus having a boron ion source of boron trichloride. Bombardment of the surface is then effected with the plane of the surface 2 normal to the direction of the ion beam. The beam energy is 100 KeV and the dose is $1 \times 10^{15}$ boron ions/sq.cm. Under these conditions of bombardment the gate electrode layer 10, 5 acts as a mask since boron ions of this energy although being able to penetrate the aluminum layer part 10 substantially cannot penetrate the molybdenum layer 5. Similarly ions that penetrate the portions of the aluminum layer parts 11 and 12 located on the molybdenum layer part 6 around the periphery cannot penetrate the underlying molybdenum layer part 6. Penetration of the aluminum layer parts 11 and 12 in the openings in the insulating layer 4 does occur under these conditions of bombardment with this thickness of the aluminum layer parts, viz. 2,000 A. The ions also pentrate the uncovered thinner oxide layer portions on opposite sides of and immediately adjacent the gate electrode structure 10, 5, 4. Furthermore some ions which penetrate the portions of the aluminum layer parts 11 and 12 situated on the thinner oxide layer 4 also penetrate the underlying portions of the thinner oxide layer 4. However, ions which penetrate the very small portions of the aluminum layer parts 11 and 12 situated on the inner periphery of the thicker oxide layer 3 are arrested in the underlying thicker oxide layer and substantially do not reach the underlying semiconductor surface. This results in the selective implantation of boron ions in the surface parts on opposite sides of the surface part below the gate electrode structure 10, 5, 4 including the surface parts below the aluminum layer parts 11 and 12 in the openings 7 and 8 respectively. Implanted low resistivity p-type regions 17 and 18 are formed which constitute source and drain regions that occupy the whole surface area at the openings 7 and 8 and due to the masking effect of the gate electrode structure 10, 5, 4, there is defined in the n-type surface region below the gate electrode layer 10, 5 a current carrying channel region the length of which in the direction between the source and drain regions 17 and 18 corresponds substantially to the dimension of the gate electrode layer 10, 5 in said direction, that is, 6 microns in the section shown in FIG. 5.

Due to the presence of the exposed portions 14 and 15 of the original openings 7 and 8 respectively in the thinner oxide layer 4, implantation occurs preferentially in the underlying portions. In the portions of the implanted source and drain regions 17 and 18 which lie directly below the aluminum layer parts 11 and 12 some aluminum atoms have been implanted in the silicon surface parts by energy transfer from the bombarding boron ions', so-called "knock-on" implantation. This provides a good low resistance contact between the aluminum layer parts 11 and 12 and the implanted source and drain regions 17 and 18.

Figure 5:
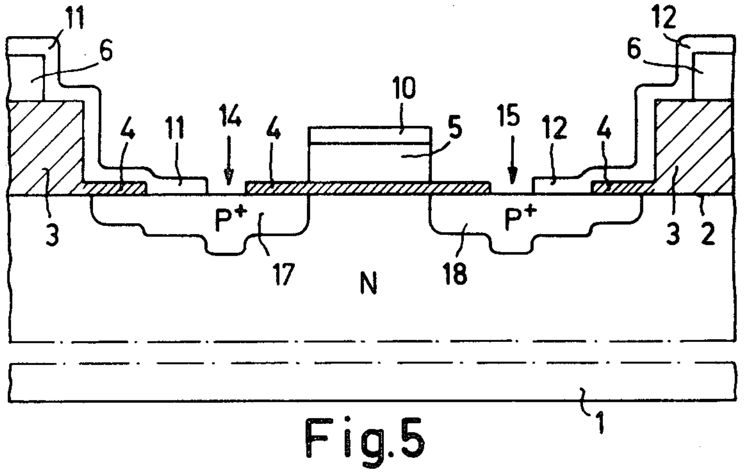
Figure 6:
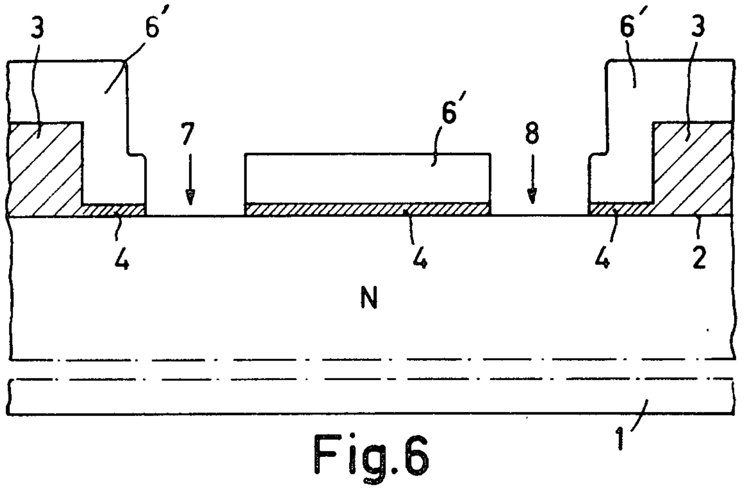

After removing the body from the ion bombardment apparatus an annealing step is carried out at 500°C. for 30 minutes. The structure shown in FIG. 5 is obtained after this implantation and annealing step. The maximum depth from the surface 2 of the junctions between the implanted p-type source and drain regions and the n-type body is approximately 0.7 microns.

A final photoprocessing and etching step is then carried out to define in the outer part of the common aluminum and molybdenum layers, from which the aluminum layer parts 10, 11 and 12 extend, separated outer source, drain and gate electrode layer parts on the thicker oxide layer 3, each consisting of an underlying molybdenum layer part and an overlying aluminum layer part and having a portion for contact purposes.

It is to be noted that during the implantation step the aluminum layer parts 10, 11 and 12 situated on the molybdenum layer parts 6, 5 are all connected together via the common outer aluminum and molybdenum layer parts. These common aluminum and molybdenum layer parts are connected to an earthing point on the ion accelerator in order to prevent the charging up of the layer and the possible consequent breakdown of the insulating layer part below the gate electrode layer 10, 5.

The use of a molybdenum layer in the gate electrode provides a lower threshold voltage in the completed device, for example 2.0 volts, than is normally obtainable using a single aluminum gate electrode layer. Furthermore the use of aluminum for the source and drain metal layer parts whilst permitting penetration by the bombarding boron ions also provides good low resistance contacts to the implanted source and drain regions.

The slice having a plurality of transistor structures as shown in the individual part in FIG. 5 is then divided along score lines and mounting and encapsulation is carried out in a conventional manner. The series resistance of such a p-channel transistor is 100 ohms and the 'on' resistance is 4 K ohms. Thus the series resistance is a very small fraction of the 'on' resistance. The gate to drain capacitance is $10^{-14}$ Farads. The drain to substrate breakdown voltage is approximately 35 volts and the drain to substrate leakage approximately 15 picoamps at $V_0 = 10$ volts.

In an adaptation of the above described method in which the transistor forms part of a semiconductor integrated circuit the photoprocessing and etching step to define separated source, drain and gate electrode layer parts can be carried out prior to implantation by defining these parts at the same time, that is using a single mask, as defining the aluminum layer 9 to form the layer parts 10, 11 and 12. The prevention of charging of the gate electrode layer is not so relevant in an integrated circuit since in the defined interconnection pattern formed at this stage the gate electrode is connected to another part of the semiconductor body, for example the area of the drain region to be formed of another similar transistor.

Referring now to FIGS. 6 to 9, another method of manufacturing a p-channel silicon insulated gate field effect transistor will now be described. The starting material is a slice of n-type silicon of approximately 2.5 cm. diameter and 3 ohm-cm. resistivity. The preparation of the surface and growth of oxide layers is substantially the same as in the previous embodiment, corresponding reference numerals being used in FIG. 1 for the same body parts and the thicker and thinner oxide layers. The method differs in the steps after the oxide layer formation in that instead of depositing a molybdenum layer over the whole surface, a relatively thick aluminum layer 6' is deposited over the whole surface, this aluminum layer having a thickness of approximately 6,000 A. By a photoprocessing and etching step openings 7 and 8 are formed in the thick aluminum layer 6 and the underlying thinner oxide layer 4, said openings corresponding exactly in size and position to the similarly referenced openings in FIG. 2 of the first embodiment.

Figure 7:
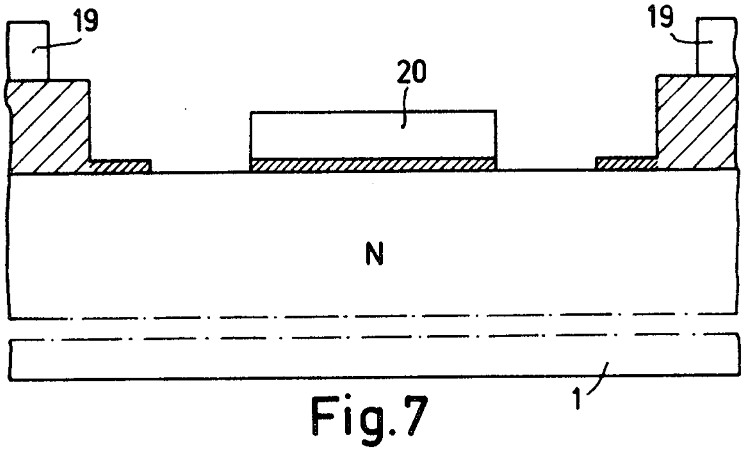

By a photoprocessing and etching step the aluminum layer 6 is further selectively removed from two rectangular areas of 5 microns × 60 microns extending parallel to and at the outer edges of the openings 7 and 8 to leave an inner portion 20 on the thinner oxide layer 4 between the openings 7 and 8 and having an area of 12 microns × 60 microns and an outer portion 19 on the thicker oxide layer 3. FIG. 7 shows the body after this aluminum layer definition.

Figure 8:
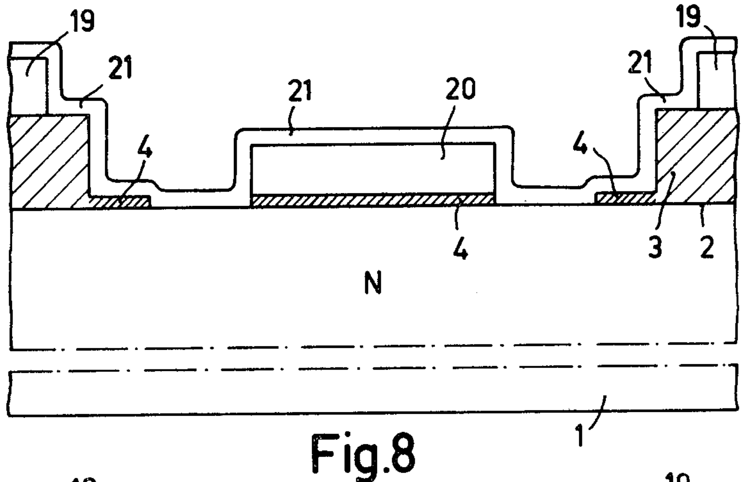
Figure 9:
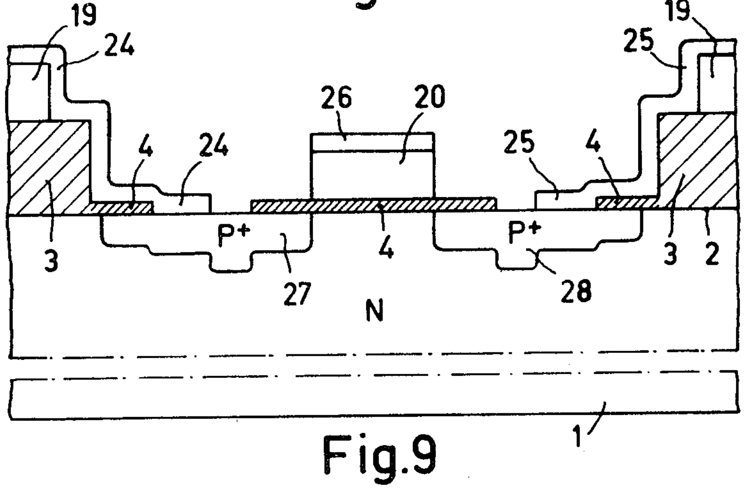

A thinner aluminum layer 21 of 2,000 A. thickness is then deposited over the whole surface, including on the remaining layer parts 19 and 20 and in the openings 7 and 8. The composite aluminum layer 21, 20 on the central portion of the thinner oxide layer 4 is now of 8,000 A. thickness as also is the composite layer 21, 19 on the thicker oxide layer 3 and FIG. 8 shows the body after this aluminum deposition.

By a further photoprocessing and etching step the aluminum layer 21 and the underlying aluminum layer part 20 are selectively removed to leave aluminum layer parts 24 and 25 which correspond exactly in area and position to the aluminum layer parts 11 and 12 shown in FIG. 4 of the first embodiment and further extend first on the thicker oxide layer 3 and then on the thick aluminum layer part 19, and a composite aluminum layer 26, 20 consisting of a part 20 of the initially applied layer of 6,000 A. thickness and an overlying part 26 of the subsequently applied layer of 2,000 A. thickness. The composite layer 26, 20 corresponds exactly in area and position to the composite gate electrode layer 10, 5 shown in FIG. 4 of the first embodiment. The aluminum layer parts 24 and 25 constitute source and drain electrode layer parts and the composite aluminum layer 26, 20 constitutes the gate electrode layer. By the definition of the composite gate electrode layer and the source and drain aluminum layer parts simultaneously in the photoprocessing and etching step a narrow separation is achieved between the gate and the source and drain aluminum layer parts, in this case 5 microns on each side which yields a low series resistance in the finally produced device.

An ion bombardment and annealing step is then carried out under the same conditions as in the first embodiment and implanted low resistivity p-type source and drain regions 27 and 28 (FIG. 9) are formed by the same mechanism as in the first embodiment. The difference resides in that the gate electrode-layer masking is achieved in this embodiment due to the composite aluminum layer 26, 20 having a larger thickness, that is, 8,000 A., which is sufficient to prevent the penetration of boron ions of 100 KeV energy since the range of such ions in aluminum is approximately 5,000 A. The subsequent processing of the device corresponds substantially with that described in the previous embodiment, that is, peripheral thin and thick aluminum layer definition to form separated source, drain and gate electrode layers, scoring and breaking of the slice followed by mounting and encapsulation.

A third embodiment of a method of forming a p-channel silicon insulated gate field effect transistor will now be described with reference to FIGS. 10 and 11. This embodiment is a modification of the second embodiment described with reference to FIGS. 6 to 9. In this method the starting material also is a slice of n-type silicon of 2.5 cm. diameter and 3 ohm-cm. resistivity. Thick and thin oxide layers 3 and 4 respectively are formed as before with the difference that the thinner oxide layer 4 in this method has an area of 38 microns × 50 microns. As in the previous embodiment a relatively thick aluminum layer of 6,000 A. thickness is applied over the whole surface. This aluminum layer is then selectively removed by a photoprocessing and etching method to leave a centrally disposed strip 31 of 6 microns × 60 microns on the thinner oxide layer 4 and an outer portion (not shown) on the thicker oxide layer 3. Another photoprocessing and etching step is then carried out to form openings 32 and 33 in the layer 4 on opposite sides of the aluminum layer 31, these openings each having an area of 5 microns × 40 microns. FIG. 10 shows a part of the body at this stage of the processing.

A thinner aluminum layer of 2,000 A. is then deposited over the entire surface, including the thick aluminum layer part 31, the peripheral thick aluminum layer part (not shown) and in the openings 32 and 33 in the thinner oxide layer 4.

A photoprocessing and etching step is carried out to selectively remove the thinner aluminum layer and leave a part 35 on the thicker aluminum layer part 31, and parts 36 and 37 on opposite sides of the composite layer 35, 31, the parts 36 and 37 extending further on the thin oxide layer 4, then on the thick oxide layer 3 and then on the peripheral thick aluminum layer part (not shown). The aluminum layer parts 36 and 37 constitute source and drain metal layer parts and occupy the total area of the openings 32 and 33 respectively and further extend over the parts of the thinner insulating layer 4 between the openings 32, 33 and the composite, aluminum layer 35, 31. Thus this embodiment differs from the previously described embodiments in that no semiconductor surface portions are exposed in the openings in the thinner oxide layer, which openings are wholly occupied by the source and drain metal layer parts in this embodiment. The layer parts 36 and 37 are spaced from the adjoining edges of the composite layer 35, 31 by a distance of 5 microns.

Implantation is then effected under the same conditions as used in the second embodiment to yield implanted low resistivity p-type source and drain regions 38 and 39. It will be evident that by the presence of the source and drain metal layer parts 36 and 37 in the whole area of the openings in the thinner insulating layer, implantation in the surface parts below these openings is effected wholly by boron ion penetration of the aluminum layer parts therein and "knock-on" of aluminum atoms occurs which yield good low resistance contact to the implanted regions. However, the lateral extent of the implanted source and drain regions obtained in this device is greater as a consequence of the different mask dimensions that have to be used to determine the electrode layer structure of this particular form. This may result in an increase in the series resistance.

It will be appreciated that many modifications may be made within the scope of the invention as defined in the appended claims. In the first embodiment described with reference to FIGS. 1 to 5, a modification may be made by using nickel instead of molybdenum for the gate electrode layer part on the thinner insulating layer 4. Also as a further modification the molybdenum layer, or if desired the nickel layer, can be applied after forming the aluminum layer parts 11 and 12 by applying a photoresist layer on the surface including initially formed layer parts 11 and 12, removing the photoresist only at the area to be occupied by the gate electrode molybdenum or nickel layer, depositing molybdenum or nickel over the whole surface and then removing it from the unwanted areas by dissolving the underlying photoresist. In this manner a gate electrode layer of only one metal, this is, molybdenum or nickel, is obtained. Other materials may be used either singly or in combination with silicon oxide. For example at least below the gate electrode layer the insulating material may consist of a first layer consisting of silicon oxide on the semiconductor surface and a second layer thereon consisting of silicon nitride.

In some cases the applied gate electrode layer may consist of semiconductor material which is subsequently rendered sufficiently conductive by the ion bombardment and yet still provides the desired masking effect.

The method may be employed in the manufacture of a semiconductor integrated circuit comprising at least one insulated gate field effect transistor and the ion bombardment may be used to determine regions of other circuit elements in the semiconductor body. Furthermore, the method may also be employed to form n-channel silicon insulated gate field effect transistors using, for example, phosphorus or nitrogen as the bombarding ions.

We claim:

1. A method of manufacturing an insulated gate field effect transistor having spaced source and drain regions whose edges terminate at a surface of a semiconductor body and which are separated by a surface channel region, comprising providing a semiconductor body having a surface portion of one conductivity type, providing on the surface portion a layer of ion-penetrating insulating material, providing over only the channel region to be formed an ion-masking gate electrode structure, providing over body portions bounding the source and drain edges to be formed and remote from the channel an ion-masking layer, forming in the ion-penetrating insulating layer openings located over and smaller than the source and drain regions to be formed and lying inside of and spaced from said source drain peripheral edges, providing source and drain electrode layers comprising ion-penetrating continuous metal layers extending over the insulating material and through the said openings to form ohmic contacts with the source and drain regions to be formed, and thereafter ion bombarding said surface with ions of a conductivity type determining impurity element characteristic of the opposite conductivity type under conditions such that the ions do not penetrate the ion-masking layers but do penetrate the ion-penetrating layers to thereby form in the surface portion wholly by ion implantation source and drain regions of the opposite conductivity type forming p-n junction edges which terminate at the surface below said insulating material and which define below the gate electrode layer a channel region whose length is substantially equal to the corresponding dimension of the gate electrode layer.

2. An insulated gate field effect transistor made by the process of claim 1.

3. A method as claimed in claim 1 wherein a gate electrode is provided which has a different structure compared to the source and drain metal layer parts.

4. A method as claimed in claim 3, wherein the gate electrode is of metal and is of different composition than that of the source and drain metal layer parts.

5. A method as claimed in claim 4, wherein the source and drain metal layer parts are of aluminum and the gate electrode comprises a molybdenum or nickel layer on the insulating material.

6. A method as claimed in claim 5, wherein the gate electrode further comprises an aluminum layer on the molybdenum or nickel layer, said aluminum layer being provided simultaneously with the source and drain metal layer parts.

7. A method as claimed in claim 3, wherein the gate electrode is of metal and the source and drain metal layer parts are of the same metal but of smaller thickness than the gate electrode metal layer.

8. A method as claimed in claim 3, wherein the insulating material is on the surface below a gate electrode layer and the insulating material on the surface below the source and drain metal layer parts adjacent the openings consist of the same insulating layer which is formed prior to providing the source, drain and gate electrode layers.

9. A method as claimed in claim 8, wherein a first, thicker insulating layer is provided on the semiconductor surface, an area of said first insulating layer is removed, and therafter a second, thinner ion-penetrating insulating layer is formed on the semiconductor surface at said area, openings being formed in the thinner insulating layer and the gate electrode layer and the source and drain metal layer parts being provided on the thinner insulating layer.

10. A method as claimed in claim 9, wherein the source, drain and gate electrode layers further extend on the first thicker insulating layer, the parts of the electrode layers on the first thicker insulating layer having a thickness sufficient to prevent the penetration of the bombarding ions into the underlying thicker insulating layer and semiconductor surface.

11. A method as claimed in claim 1, wherein the source and drain metal layer parts are provided so that they do not occupy the total area of the openings in the insulating material, and implantation of ions is effected preferentially in the surface parts below the openings which are not covered by the metal layer parts.

12. A method as claimed in claim 1, wherein the conditions of ion bombardment are such that at least at the areas where the source and drain metal layer parts contact the semiconductor surface atoms of the metal layer parts are caused to enter the underlying surface parts by energy transfer from the bombarding ions.

* * * * *